US008507388B2

(12) United States Patent
Van Aerde et al.

(10) Patent No.: US 8,507,388 B2
(45) Date of Patent: Aug. 13, 2013

(54) PREVENTION OF OXIDATION OF SUBSTRATE SURFACES IN PROCESS CHAMBERS

(75) Inventors: Steven R. A. Van Aerde, Tielt-Winge (BE); Rene de Blank, Heverlee (BE)

(73) Assignee: ASM International N.V., Almere (NL)

( * ) Notice: Subject to any disclaimer, the term of this patent is extended or adjusted under 35 U.S.C. 154(b) by 615 days.

(21) Appl. No.: 12/767,657

(22) Filed: Apr. 26, 2010

(65) Prior Publication Data

US 2011/0263134 A1  Oct. 27, 2011

(51) Int. Cl.
*H01L 21/31* (2006.01)

(52) U.S. Cl.
USPC ......................................................... 438/763

(58) Field of Classification Search
None
See application file for complete search history.

(56) References Cited

U.S. PATENT DOCUMENTS

| | | | |
|---|---|---|---|
| 5,008,160 A | 4/1991 | Jenkin | |
| 5,132,756 A | 7/1992 | Matsuda | |
| 5,352,656 A | 10/1994 | Lackey et al. | |
| 5,518,061 A | 5/1996 | Newkirk et al. | |
| 5,545,578 A | 8/1996 | Park et al. | |
| 5,589,421 A | 12/1996 | Miyashita et al. | |
| 5,756,392 A | 5/1998 | Lu et al. | |
| 5,814,556 A | 9/1998 | Wee et al. | |
| 5,834,068 A | 11/1998 | Chern et al. | |
| 5,872,017 A | 2/1999 | Boydston et al. | |
| 5,916,378 A | 6/1999 | Bailey et al. | |
| 5,985,691 A | 11/1999 | Basol et al. | |
| 6,110,844 A * | 8/2000 | Rader et al. | 438/795 |
| 6,180,542 B1 | 1/2001 | Hwang | |
| 6,193,911 B1 | 2/2001 | Hunt et al. | |
| 6,204,204 B1 | 3/2001 | Paranjpe et al. | |
| 6,265,297 B1 | 7/2001 | Powell | |
| 6,306,756 B1 | 10/2001 | Hasunuma et al. | |
| 6,310,327 B1 | 10/2001 | Moore et al. | |
| 6,425,951 B1 | 7/2002 | Chu et al. | |
| 6,458,714 B1 | 10/2002 | Powell et al. | |
| 6,500,350 B1 | 12/2002 | Hunt et al. | |

(Continued)

FOREIGN PATENT DOCUMENTS

| | | |
|---|---|---|
| JP | 58-123866 | 7/1983 |
| JP | 12-04448 | 8/1989 |
| JP | 2001-262378 | 9/2001 |
| WO | WO 93/19222 | 9/1993 |

OTHER PUBLICATIONS

Audisio, "Chemical Vapor Deposition of Tin on Iron or Carburized Iron," J. Electrochem Soc., Oct. 1980, pp. 2299-2304, vol. 127, Issue 10, Laboratoire de Physicochimie Industrielle, Institut National des Sciences Appliquees de Lyon, Villeurbanne Cedex, France.

(Continued)

*Primary Examiner* — Scott B Geyer
(74) *Attorney, Agent, or Firm* — Knobbe, Martens, Olson & Bear LLP

(57) ABSTRACT

In some embodiments, a reducing gas ambient containing a reducing agent is established in a batch process chamber before substrates are subjected to a deposition. The reducing atmosphere is established before and/or during loading of the substrates into the process chamber, and can include flowing reducing gas into the process chamber while the chamber is open. The reducing gas can be a mixture of a reducing agent and an inert gas, with the reducing agent being a minority component of the reducing gas. Using the reducing gas ambient, oxidation of substrate surfaces is reduced.

24 Claims, 8 Drawing Sheets

(56) References Cited

U.S. PATENT DOCUMENTS

| | | | |
|---|---|---|---|
| 6,734,102 | B2 | 5/2004 | Rathi et al. |
| 6,743,473 | B1 | 6/2004 | Parkhe et al. |
| 6,858,524 | B2 | 2/2005 | Haukka et al. |
| 6,890,867 | B2 | 5/2005 | Powell |
| 7,015,151 | B2 | 3/2006 | Powell |
| 7,022,541 | B1 | 4/2006 | Yenilmez et al. |
| 7,129,188 | B2 | 10/2006 | Powell |
| 7,211,508 | B2 | 5/2007 | Chung et al. |
| 7,238,595 | B2 | 7/2007 | Brabant et al. |
| 7,435,665 | B2 | 10/2008 | Airaksinen et al. |
| 2002/0052124 | A1 | 5/2002 | Raaijmakers et al. |
| 2002/0092584 | A1 | 7/2002 | Soininen et al. |
| 2003/0173347 | A1 | 9/2003 | Guiver |
| 2004/0047993 | A1 | 3/2004 | Kumar et al. |
| 2004/0154185 | A1 | 8/2004 | Morad et al. |
| 2006/0115984 | A1 | 6/2006 | Park et al. |
| 2006/0240680 | A1 | 10/2006 | Yokota et al. |
| 2006/0252258 | A1 | 11/2006 | Wu et al. |
| 2007/0259111 | A1 | 11/2007 | Singh et al. |
| 2008/0054326 | A1 | 3/2008 | Wong et al. |
| 2009/0142513 | A1* | 6/2009 | Murakami et al. ............ 427/576 |

OTHER PUBLICATIONS

Behner, "Surface composition of CVD-grown a-SiC layers—an XPS and LEED study," Applied Surface Science, May 1996, pp. 27-33, vol. 99, Issue 1.

Champeaux, "In situ growth of YBaCuO superconducting thin films by excimer laser ablation: influence of deposition and cooling parameters," Applied Surface Science, May 1993, pp. 335-339, vol. 69, Issues 1-4.

Chen et al., "Oxidation behavior of titanium nitride films," J. Vac. Sci. Technol. A 23(4), pp. 1006-1009 (Jul./Aug. 2005).

Frohlich, "Characterization of rare earth oxides based MOSFET gate stacks prepared by metal-organic chemical vapour deposition," Materials Science in Semiconductor Processing, Dec. 2006, pp. 1065-1072, vol. 9, Issue 6.

Galata, "Post deposition annealing studies of lanthanum aluminate and ceria high-k dielectrics on germanium," Microelectronics Reliability, Apr.-May 2007, pp. 532-535, vol. 47, Issues 4-5.

Lu, "A Novel Process for Fabricating Conformal and Stable TiN-Based Barrier Films," J. Electrochem Soc., Dec. 1996, pp. L279-L280, vol. 143, Issue 12, Texas Instruments, Dallas, Texas, United States.

Mori, "Effect of Ambient on the Surface Resistance of Diamond Films during Cooling after Deposition," Japanese Journal of Applied Physics, 1992, pp. L1718-L1720, vol. 31, Osaka University, 2-1 Yamada-oka, Suita, Osaka 565.

Reitmeier, "In situ cleaning of GaN(0001) surfaces in a metalorganic vapor phase epitaxy environment," J. Vac. Sci. Technol., Sep. 2004, p. 2077-2082, vol. 22, Issue 5, North Carolina State University, Raleigh, North Carolina, United States.

Saha et al., "Titanium nitride oxidation chemistry: An x-ray photoelectron spectroscopy study," J. Appl. Phys. 72 (7), pp. 3072-3079 (Oct. 1, 1992).

Tenne, "Characterization of oriented thin films of WSe2 grown by van der Weals rheotaxy," Thin Solid Films, Jan. 1996, pp. 38-42, vol. 272, Issue 1.

Verrelli, "Deposition and electrital characterization of hafnium oxide films on silicon," Physica status solidi, pp. 3720-3723, vol. 5, Issue 5, Greece.

Yamamoto et al., "Thermal Stability of Nitrogen in WNx Barriers Applied to Polymetal Gates," J. Vac. Soc. Technol. B. 23(4), pp. 1664-1673 (Jul./Aug. 2005).

Yim, "Dependence of the electrical and optical properties of sputter-deposited ZnO: Ga films on the annealing temperature, time, and atmosphere," Journal of Materials Science: Materials in Electronics, Apr. 2007, pp. 385-390, vol. 18, No. 4, Kluwer Academic Publishers, Inha University, Inchon, South Korea.

\* cited by examiner

PREVENTION OF OXIDATION OF SUBSTRATE SURFACES IN PROCESS CHAMBERS

REFERENCE TO RELATED APPLICATION

This application is related to U.S. Ser. No. 12/390,145, filed Feb. 20, 2009.

BACKGROUND

1. Field of the Invention

This application relates generally to semiconductor fabrication and, more particularly, to preventing oxidation of substrate surfaces in a process chamber.

2. Description of the Related Art

Semiconductor device fabrication is a complex process. Electronic devices are typically formed on a semiconductor substrate, and often include conductive elements separated by insulating elements. Conductive elements may serve as, e.g., electrodes and interconnecting conductors.

As an example, various electronic devices, such as transistor devices, exist in the modern day fabrication of integrated circuits, with metal-oxide-semiconductor field-effect transistors (MOSFET) being a common transistor device. Generally, a MOSFET includes a conductive gate electrode formed over a gate dielectric, which in turn overlies a semiconductor substrate that can be single-crystal silicon. For reliable performance in electronic devices, such as a MOSFET, it is desirable to maintain the conductivity of the conductive parts, such as a gate electrode, which may be composed of such conductive materials as metals or metal nitrides. Similar considerations apply for other materials relied upon for their conductivity.

Accordingly, there is continuing need for processes that provide conductive materials having high conductivity or low resistivity.

SUMMARY

According to some embodiments of the invention, a method for thermal processing of substrates is provided. The method comprises providing a reducing gas ambient in a process chamber by flowing a reducing gas into the chamber prior to loading one or more substrates into the chamber. The substrates are loaded into the reducing gas ambient in the chamber while the chamber is at a loading temperature. The substrates are processed at a process temperature.

According to some other embodiments of the invention, a method for thermal processing of substrates is provided. The method comprises providing a reducing gas ambient in a process chamber by flowing a reducing gas into the chamber prior to loading one or more substrates into the chamber. The substrates are loaded into the reducing gas ambient in the chamber while the chamber is at a loading temperature. The substrates and the chamber are heated so that the substrates are heated to a process temperature. The substrates are processed at the process temperature. The chamber is cooled to an unloading temperature. The substrates are unloaded while the chamber is at the unloading temperature.

According to other embodiments of the invention, a method for substrate processing is provided. A first material is deposited on a substrate in a first process chamber. The substrate is unloading from the first process chamber. The substrate is subsequently loaded into a second process chamber. A second material is deposited on the substrate in the process chamber. A reducing ambient is provided in the second process chamber during subsequently loading the substrate into the second process chamber.

BRIEF DESCRIPTION OF THE DRAWINGS

The application will be better understood from the detailed description and from the appended drawings, which are meant to illustrate and not to limit the application, and wherein.

DETAILED DESCRIPTION

Figure 1:
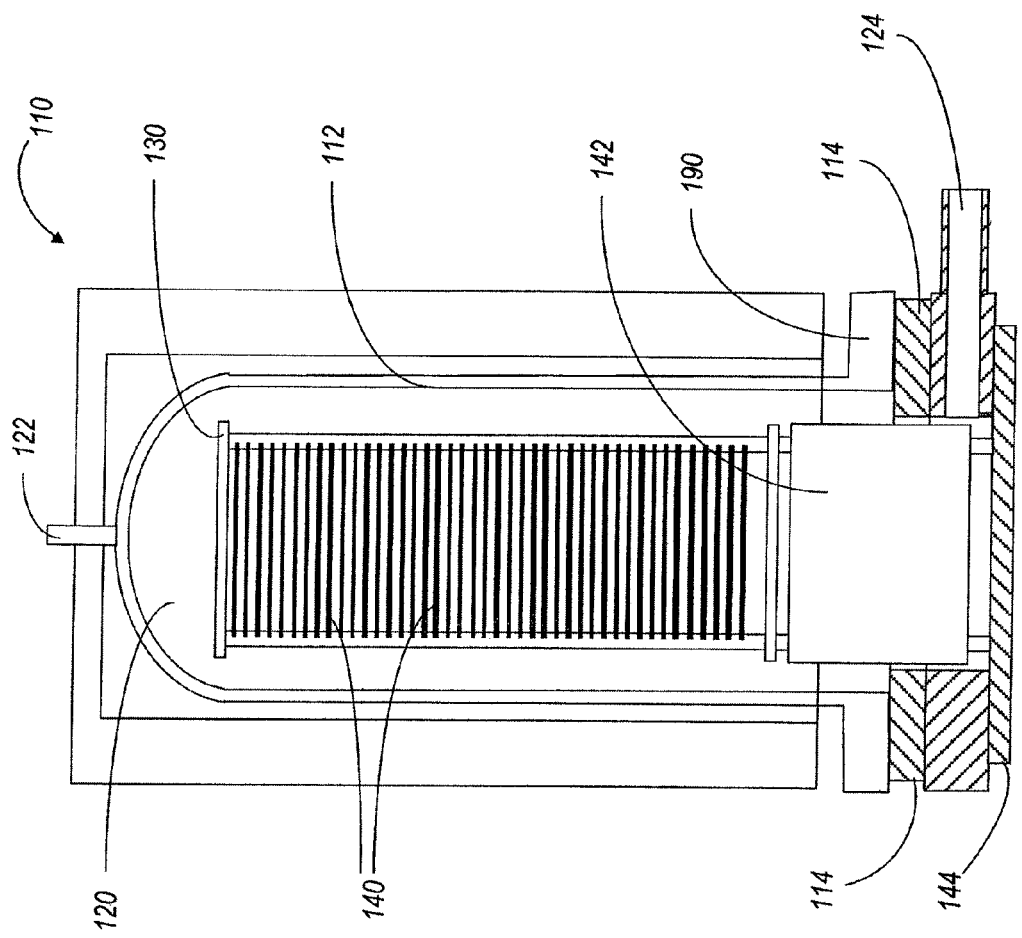
FIG. 1 illustrates a vertical furnace reactor for use with some embodiments of the invention.

The interiors of process or deposition chambers, such as chemical vapor deposition (CVD) chambers, are highly controlled environments. Temperatures, pressures, and the presence and concentrations of reactive chemical species are closely controlled to achieve a desired process result, such as the deposition of films on substrates in the chamber. Consequently, the gases, including inert gases, flowed into the chamber are of high purity.

To further minimize the possibility of undesired contact with external contaminants, deposition or process chambers can be clustered. Typically, individual depositions are performed in dedicated chambers configured for that individual deposition. In some cases, processes such as depositions are sequentially performed on substrates. The substrates are transferred from a first chamber to a second chamber to perform the sequential depositions or other treatment. These chambers can be clustered; that is, they can be located, or clustered together, in a common sealed mini-environment. In such cases, substrates to be unloaded from the first chamber and subsequently directly loaded into the second chamber are transported through the sealed mini-environment. The mini-environment can comprise an inert gas. Intermediate transport steps such as loading and moving substrates in wafer carriers or FOUPS in an external environment can be avoided, thereby potentially eliminating the contamination possible when carrying out those transport steps.

Nevertheless, even with precautions such as clustering, some undesired reactants have been found to reach substrates processed in the process chambers. For example, even where inert gas fills the sealed mini-environment and also the process chambers themselves, it has been found that undesired oxidation of the substrates still occurs during loading of the substrates into the process chamber, including while the process chamber is at a loading temperature of about 100° C. or higher. This oxidation occurs even where the deposition in the chamber does not utilize an oxidant, e.g., where a metal or metal nitride is deposited. Without being limited by theory, it is believed that oxidants may be present in the mini-environment in residual amounts. The level of residual impurities in the mini-environment is believed to be substantially higher than the level of residual impurities in the process chamber. The mini-environment comprises large boundary surfaces at room temperature which may absorb/desorb impurities and which may not be perfectly gas tight. During loading of the substrates into the process chamber, the process chamber is open to the mini-environment and the level of impurities in the process chamber is relatively high and in case of a loading temperature above room temperature, e.g. about 100° C. or higher, unintentional oxidation of the substrates may occur. Further, it is believed that oxidants may be present in the inert gas source itself, and/or may be picked up from the gas delivery system over the course of flowing the inert gas to the mini-environment and to the chamber, and/or may be present in the chamber in a residual amount.

The oxidants cause oxidation of metal-containing materials, which can result in undesirable oxygen incorporation and undesirable increases in resistivity in these materials. The oxidation is particularly problematic for thinly deposited films, such as thin metal nitride films. Any oxidized material would make up a larger fraction of such thin films, in comparison to a thicker film. Presently, as the scale of integrated circuits continues to be reduced, such that thinner metal nitride films are becoming increasingly common, these problems with oxidation are becoming magnified.

Advantageously, embodiments of the invention control oxidation by establishing a reducing gas ambient in a process chamber before performing a deposition or other treatment in the chamber. In some embodiments, the process chamber is filled with the reducing gas before substrates are loaded into the chamber. For example, after a first batch of substrates is processed, the chamber can be filled with reducing gas, e.g., before or after unloading of those substrates, thereby establishing a reducing ambient for a second batch of substrates. Then the chamber can be loaded with the second batch of substrates. In some other embodiments, the reducing gas is additionally flowed into the process chamber during and/or directly after loading substrates into the chamber, e.g., the reducing gas can be flowed into the process chamber while the chamber is open. The reducing gas ambient is established while the process chamber is at a loading temperature. The loading temperature may be about 100° C. or higher, or about 200° C. or higher, or about 300° C. or higher. After the reducing gas ambient is established, and the substrates have been loaded at the loading temperature, the substrates can be subjected to a thermal process at a process temperature. The process temperature may be equal to the loading temperature or may be different from the loading temperature. Preferably the process temperature is higher than the loading temperature. For example, the chamber pressure can be reduced, the substrates can be heated to a process temperature and material can be deposited on substrate surfaces. In some embodiments, the process chamber is located in a sealed mini-environment with at least one other process chamber, thereby allowing for clustered processing of substrates in the chambers.

The reducing agent is a minority component of the reducing gas. Preferably, the reducing agent is a gas that constitutes about 4 volume percent (vol. %) or less of the reducing gas, or about 2 vol. % or less of the reducing gas in some embodiments. In some embodiments, the concentration of reducing agent in the reducing gas is in the range of about 0.1 to about 4 vol. %. Advantageously, the reducing gas effectively suppresses oxidation, allowing the resistivity of deposited metal-containing films to be maintained at low levels. Moreover, the reducing gas is "safe" and non-explosive. Thus, the process chamber can advantageously be opened and brought into communication with an unloading ambient, and ultimately with a clean room ambient and substrates can be unloaded while the process chamber is still filled with the reducing gas, without needing to change the composition of the process chamber atmosphere. Preferably, the reducing gas ambient is a non-plasma ambient; that is, a plasma is not generated in the chamber while the reducing gas is being flowed into the chamber, before substrates are processed in that chamber.

Advantageously, the timing and location for establishing the reducing gas ambient has been found to be significant. For example, establishing a reducing environment in a chamber before a thermal process in that chamber provides exceptional results compared to exposing substrates to a reducing environment while unloading from another chamber, even where that other chamber is in a clustered mini-environment. In some embodiments, the resistivity of TiN films deposited at 600° C. are about 80 $\mu\Omega \cdot cm$ or less, or about 70 $\mu\Omega \cdot cm$ or less at film thicknesses of about 10 nm or less. In some embodiments, the resistivity of the TiN films are about 70 $\mu\Omega \cdot cm$ or less, or about 60 $\mu\Omega \cdot cm$ or less at film thicknesses of about 20 nm or less.

Reference will now be made to the figures, in which like numerals refer to like parts throughout. It will be appreciated that the methods disclosed herein for suppressing oxidation are applicable to various structures having exposed conductive surfaces, such, without limitation, as metal nitride surfaces, or transition metal nitride surfaces.

With reference to FIG. 1, a reactor for use with some embodiments is illustrated. The reactor 110 is a vertical furnace reactor, which accommodates substrates 140 vertically separated from one another and which has benefits for efficient heating and loading sequences. The substrates 140 can be, e.g., semiconductor substrates, including silicon wafers. In some embodiments, the reactor 110 can accommodate 25 or more, or 50 or more substrates. Examples of suitable vertical furnaces are the A400™ and A412™ vertical furnaces, commercially available from ASM International, N.V. of Almere, the Netherlands. It will be understood, however, that while some embodiments are presented in the context of a vertical batch furnace, the principles and advantages disclosed herein will have application to other types of known reactors, including single wafer reactors.

With continued reference to FIG. 1, a tube 112 defines a reaction chamber 120 in the interior of the vertical furnace or reactor 110. The lower end of the tube 112 terminates in a flange 190, which mechanically seals the chamber 120 by contact with a lower support surface 114. Process gases can be fed into the reaction chamber 120 through a gas inlet 122 at the top of the chamber 120 and evacuated out of the chamber 120 through a gas outlet 124 at the bottom of the chamber 120. The reaction chamber 120 accommodates a wafer boat 130 holding a stack of vertically spaced substrates or wafers 140.

Various systems can be used to supply reactants or precursors to the reaction chamber 120. For example, where the precursor is a gas, it can be flowed directly from a gas source to the chamber 120. The timing and rate of the flow of the gas can be controlled by a controller connected to the reactor 110. The controller is programmed to effectuate the processing steps disclosed herein. For example, the controller controls mass flow controllers in a piping system connected to the chamber 120 to regulate the flow of gases into the chamber 120.

Process gases can be introduced into the chamber 120 in various ways. For example, in the reactor illustrated in FIG. 1, gases are introduced into the chamber 120 of the reactor 110 at the top, via the top inlet 122, and exhausted at the bottom of the reactor 110, via the exhaust 124. In other embodiments, the process gases can be introduced through vertically-extending injectors having an array of vertically-distributed and separated holes.

Figure 2:
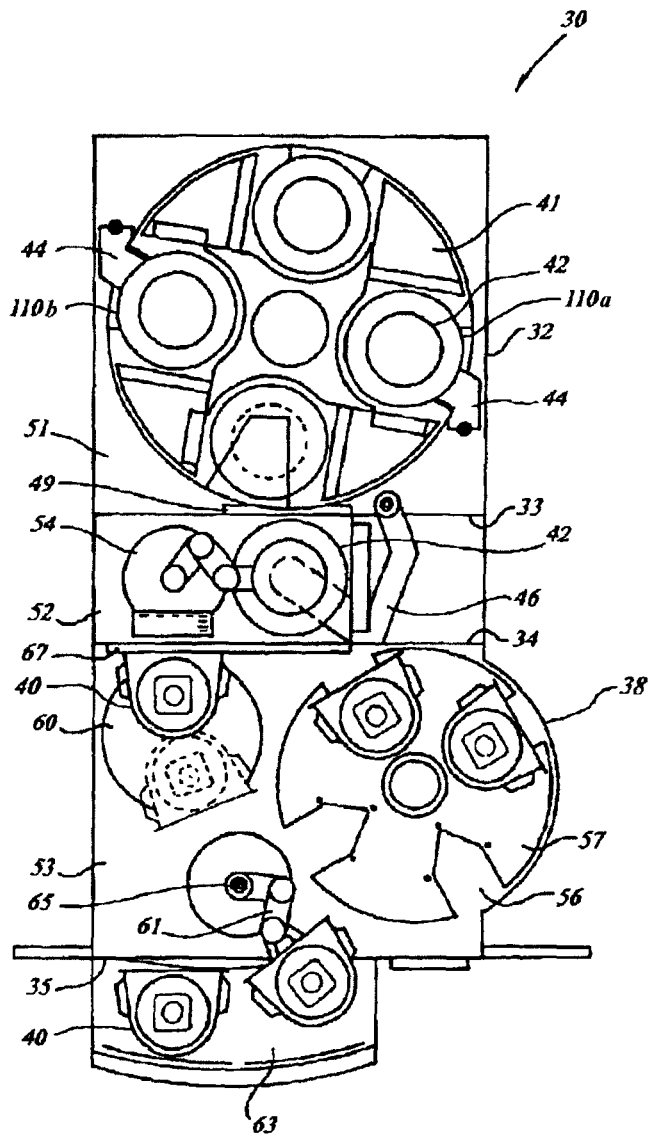
FIG. 2 is a schematic plan view of a system containing the reactor of FIG. 1, according to some embodiments of the invention.

FIG. 2 is a schematic plan view of a system 30 containing the reactor 110, according to some embodiments of the invention. The system 30 includes a housing 32 and is generally installed in a so-called "clean room." In addition to the housing 32, partitions 33, 34 and 35 are also present. The housing 32 delimits, with the partition 33, a mini-environment 51. The mini-environment 51 accommodates reactors 110, which in this example, are vertical furnaces designated 110a and 110b for ease of description. The housing 32 and the partitions 33 and 34 define a substrate handling section or chamber 52. A cassette transfer chamber 53 is defined between the housing 32 and partitions 34 and 35. An input/output station, to transfer cassettes into and out of the system 30, is indicated by reference numeral 63.

The processing of substrates can be carried out as follows: the operator, shown diagrammatically in FIG. 2, loads the store 38 by introducing a number of cassettes 40 on the input/output station 63 and carrying out control operations on a control panel at the input/output station 63. Each of the cassettes 40 is transferred from the input/output station 63 with the aid of a cassette handling device 61 into storage compartments 39 made for these cassettes 40 in a cassette store 38, specifically on stacked rotary platforms 57. By rotation of the store 38 and use of an elevator 65, it is possible to fill various compartments 56 with the cassettes 40. After filling the store 38, no further human interaction is required with this exemplary automated installation.

The cassettes 40 concerned are then removed from the store 38 by the cassette handler device 61 and placed on the cassette transfer platform 60. Upon rotation of the cassette transfer platform 60, the cassettes are placed against the partition 34. The closure of the cassette 40 and a closure 67 in the partition 34 are opened. The substrates in the cassette 40 are removed by a substrate handler 54, seated upon a substrate support and the substrate/support combination is placed in the wafer boat 42. After the wafer boat 42 has been filled, and becomes available for one of the reactors 110a, 110b, a closure 49 in partition 33 is opened and the wafer boat 130 is placed on a transfer platform 41 by the transfer arm 46. The transfer platform 41 then moves the wafer boat 42 within the mini-environment 51 to a position below the reactor 110a, 110b to be loaded. Then the insertion mechanism or elevator 44 moves the wafer boat 130 into on of the reactors 110a, 110b.

Figure 3:
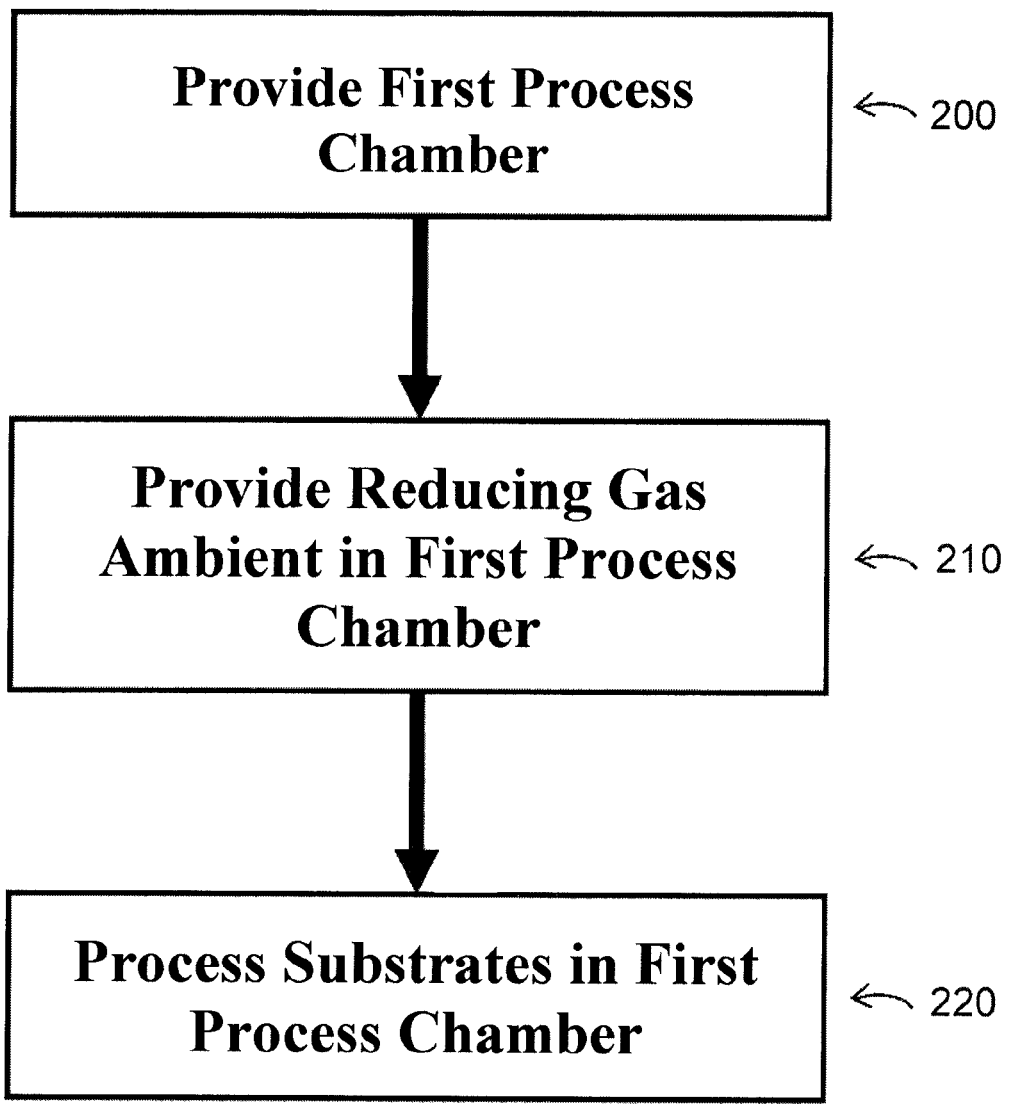
FIG. 3 is a flow chart showing a method of processing a substrate, according to some embodiments of the invention.

With reference to FIG. 3, a flow chart for a method for processing substrates according to some embodiments is provided. Initially, a first process chamber, such as the chamber 120 (FIG. 1), is provided 200. A reducing gas ambient is provided 210 in the first process chamber. Subsequently, substrates are loaded and processed 220 in the first process chamber.

The steps 200-220 may be performed as part of a larger sequence of processing steps. For example, the first process chamber may be loaded with a first batch of substrates. The first process chamber is used to subject a first batch of substrates to a thermal process between steps 200 and 210. The process may be, for example, a deposition, such as a deposition of metal-containing films, or deposition of silicon or germanium-containing films. The process chamber may be configured for various types of depositions, including low-pressure CVD, pulsed CVD, plasma-enhanced CVD, atomic layer deposition (ALD) or physical vapor deposition (PVD).

With continued reference to FIG. 3, a reducing gas ambient is provided 210 in the first process chamber. For example, the first process chamber is provided with a reducing gas ambient after the above-noted thermal process. The reducing gas ambient may be established while the first process chamber is still loaded with the first batch of substrates. For example, the first batch of substrates may be processed at reduced pressure and after processing the batch of substrates, the chamber may be backfilled with a reducing gas to establish the reducing gas ambient before unloading the batch of substrates. Methods for back-filling a process chamber with a reducing gas are disclosed in commonly assigned U.S. patent application Ser. No. 12/390,145, filed Feb. 20, 2009.

In some other embodiments, the reducing gas ambient may be established during or after unloading the first batch of substrates. For example, reducing gas may be flowed into the first process chamber while the process chamber door is open, as the batch of substrates is unloaded from the first process chamber. Alternatively, or in addition to flowing reducing gas into the first process chamber during unloading of the first batch of substrates, reducing gas may be flowed into the first process chamber while the process chamber remains open and empty of substrates. For example, after a back-fill of the process chamber with $N_2$, reducing gas can be flowed through the process chamber while it is at atmospheric pressure and in an open state.

A second batch of substrates may be loaded into the first process chamber after unloading the first batch of substrates. In some arrangements, reducing gas may additionally be flowed into the process chamber after loading the substrates, e.g., during purging and heating of the substrates before flowing deposition reactants. It will be appreciated that reducing gas may be flowed into the process chamber exclusively during one period, e.g., only during back-fill or substrate unloading, or for any combination of the periods noted herein, e.g., during unloading of the first batch of substrates, loading of the second batch of substrates, and after loading, e.g., after the second batch of substrates is inserted and the process chamber is closed.

In some embodiments, the reducing gas comprises hydrogen ($H_2$) gas as a reducing agent. Other suitable reducing agents include alcohols such as methanol, ethanol propanol, isopropyl alcohol, and combinations thereof. The reducing agent is in a mixture with an inert gas, e.g., $N_2$, Ar, He, or combinations of inert gases. Preferably, the reducing agent is a minority component of the reducing gas. For example, in some embodiments, the reducing agent constitutes about 4 vol. % or less of the reducing gas, or about 2 vol. % or less of the reducing gas. In some embodiments, the reducing agent constitutes about 0.1 to about 4 vol. % of the reducing gas, or about 0.1 to about 2 vol. % of the reducing gas.

With continued reference to FIG. 3, after a reducing gas ambient is established in the process chamber, the second batch of substrates is loaded into the first process chamber and the substrates are processed 220, e.g., material can be deposited on the substrates. For the deposition, the chamber can be heated to a relatively high deposition temperature of about 350° C. or more, or about 450° C. or more, or about 600° C. or more. In addition, the chamber can be evacuated after loading and being maintained at a low deposition pressure of about 100 Torr or less, or about 10 Torr or less, or even near a high vacuum pressure of about 0 Torr. Advantageously, the process results show exceptionally low oxygen levels.

Various materials can be deposited on the substrates, including oxidation sensitive materials, e.g., metal-containing films such as pure metals or metal nitrides, silicon or germanium-containing films. In some embodiments, the deposited film comprises a metal nitride film such as a transition metal nitride, including, without limitation, tungsten nitride, titanium nitride, titanium silicon nitride, or tantalum nitride. The film can be deposited using, e.g., blanket or selective deposition processes. The final thickness of the film can vary depending on the intended purpose of the film; in some embodiments, a conductive film is deposited that has a thickness of about 100 nm or less, or about 40 nm or less. In some embodiments, the film is deposited by chemical vapor deposition.

It will also be appreciated that the first process chamber may be accommodated in a sealed mini-environment with one or more other process chambers. Where the first process chamber is disposed in a mini-environment with other process chambers, the second batch of substrates may have been previously subjected to a process in one of the other process chambers, e.g., a second process chamber. Oxidation sensitive materials may have been deposited on the second batch of substrates in the second process chamber or the substrates may otherwise have exposed surfaces that are sensitive to oxidation. The second batch of substrates is unloaded from the second process chamber and loaded into the first process chamber, where the reducing gas ambient minimizes oxidation reactions on the substrates of second batch of substrates prior to processing. Because the process results in the second process chamber may also be sensitive to oxidation, the second process chamber may also be provided with a reducing gas ambient before subjecting the substrates to a thermal process. The reducing gas ambient may be provided as disclosed herein for the first process chamber.

It will also be appreciated that the substrates undergoing processing in the process chambers can be various types of workpieces. In some embodiments, the substrate is a single crystal silicon wafer, a semiconductor-on-insulator (SOI) substrate, or an epitaxial silicon surface, a silicon-germanium surface, or a group III-V material deposited on a wafer. Workpieces are not limited to wafers, but also include glass, plastic, or other substrates employed in semiconductor processing. In some embodiments, the substrate comprises a "mixed" substrate having two or more different types of surface morphologies such as, e.g., silicon and insulator regions.

In some embodiments, the substrate may comprise a partially fabricated integrated circuit, in which one or more layers are deposited over the substrate. The layers can include dielectric materials, such as silicon dioxide, silicon nitride, metal oxide or metal silicate. The layers can also include conductive material such as polysilicon or various types of metal, including tungsten or titanium, which can be used as gate electrode structures.

EXAMPLE

The oxygen content of films formed under various conditions were analyzed. The films were deposited on substrates in an A412™ CVD batch reactor system commercially available from ASM International, N.V. of Almere, the Netherlands. The system contained two process chambers accommodated in a common $N_2$ mini-environment. In some trials, wafer boats were loaded and transported between process chambers in the mini-environment. The gas atmosphere in the mini-environment was re-circulated using blowers and filtered by HEPA filters. A flow of 300 slm $N_2$ was applied to the mini-environment to refresh the atmosphere in the mini-environment and to keep the $O_2$ concentration in the mini-environment at a low level.

During loading of a wafer boat into a process chamber, the boat-in speed was 400 mm/min and the boat-in step time was about 4 min. The loading temperature was 300° C. After loading of the substrates into the reaction chamber and closure of the reaction chamber, the chamber was evacuated and purged, and the substrates were heated to the deposition temperature. Either amorphous silicon films ($\alpha$-Si) or titanium nitride films (TiN) were deposited by a low pressure chemical vapor deposition process. The amorphous silicon was formed using silane as the source gas at a deposition temperature of 520° C. and pressure of 0.5 Torr. The titanium nitride films were deposited by a pulsed CVD process operating at 0.22 Torr using $TiCl_4$ and $NH_3$ at a deposition temperature of 500° C. The $TiCl_4$ flow in the process chamber was pulsed, while the $NH_3$ was flowed continuously into the chamber. At the end of an immediately preceding deposition run, the chamber was backfilled to atmospheric pressure by flowing gas into the chamber.

Table 1 shows the results of various trials in which a TiN bottom layer was formed in a first deposition chamber and a top $\alpha$-Si layer was formed over the TiN layer in a second deposition chamber. In Trials 1 and 2, the TiN and the $\alpha$-Si were deposited in different process chambers that were not housed in a common mini-environment. In Trial 1, the process chamber for the TiN deposition was backfilled with inert gas after the TiN deposition. In Trial 2, the process chamber for the TiN deposition was backfilled with so-called forming gas (reducing gas formed of a mixture of $H_2$ and $N_2$, with the concentration of $H_2$ at 4 vol. %) after the TiN deposition.

In Trials 3 and 4, the TiN and the $\alpha$-Si were deposited in different process chambers that were accommodated in a common mini-environment. In Trial 3, no forming gas was used.

In Trial 4, forming gas was flowed into the process chamber for the TiN deposition during back-fill (flow rate=5 slm) and during boat out (unloading of the wafer boat from the process chamber). In addition, forming gas was flowed into the process chamber for the $\alpha$-Si deposition during boat in, or loading of the wafer boat from the process chamber (flow rate=10 slm), and, after pump down, during purging and heating of the wafer boat before flowing deposition reactants into the process chamber (flow rate=2 slm).

Figure 4:
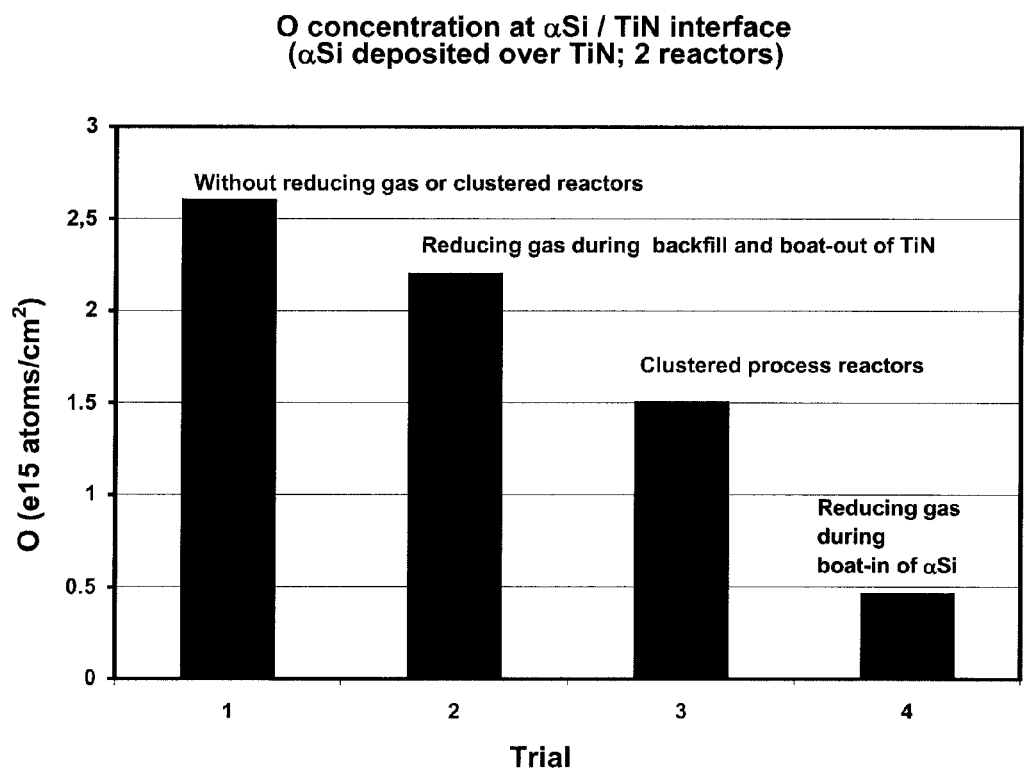
FIG. 4 is a graph illustrating oxygen levels in materials processed under different conditions, some conditions according to some embodiments of the invention.
Figure 5:
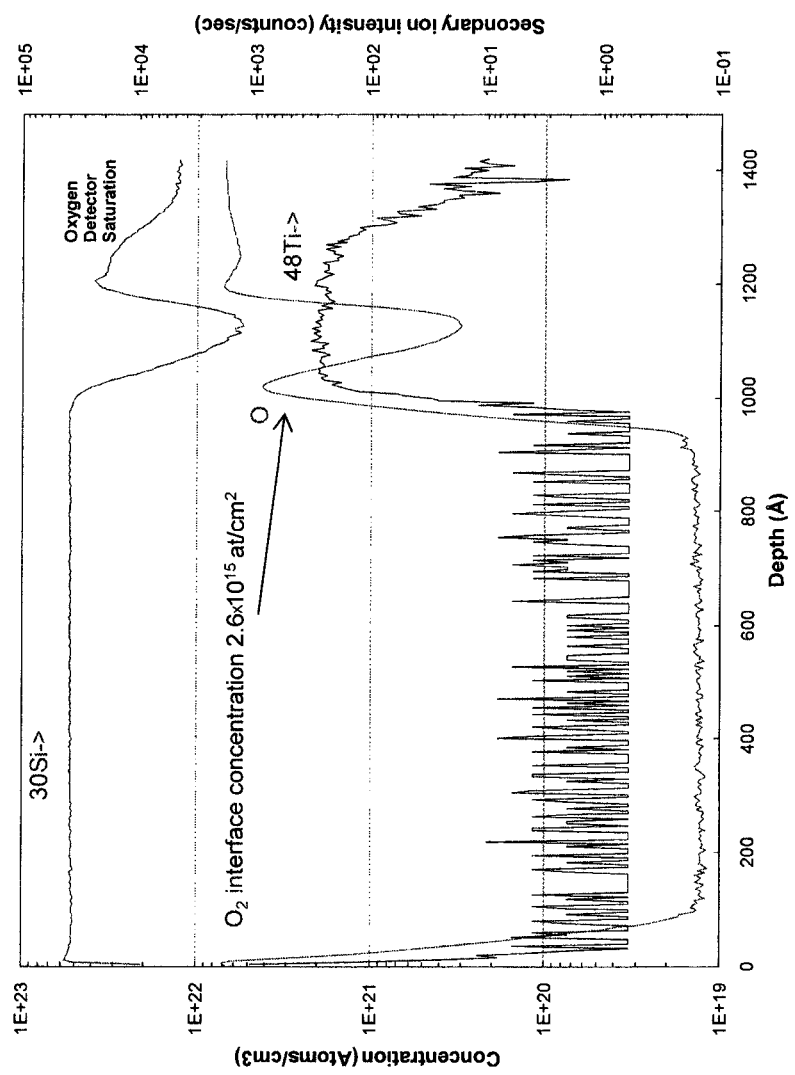
FIG. 5 is a graph illustrating oxygen levels at an aSi/TiN interface formed without using a reducing gas ambient before deposition of the top layer.

Table 1 shows the oxygen interface concentration at an interface of the TiN bottom layer and the $\alpha$-Si top layer. The results of table 1 are graphically presented in FIG. 4. It can be observed that processing a TiN layer and the $\alpha$-Si layer in two different furnaces resulted in an oxygen concentration at the interface of $2.6 \times 10^{15}$ at/cm$^2$ (Trial 1, FIG. 5). Flowing a reducing gas during backfill and boat-out after a TiN deposition process resulted in a reduction of the oxygen concentration at the interface to $2.2 \times 10^{15}$ at/cm$^2$ (Trial 2). Clustering the TiN deposition and the $\alpha$-Si deposition process chambers in an A412 system with an $N_2$ mini-environment (Trial 3) resulted in a reduction of the oxygen concentration at the interface to $1.5 \times 10^{15}$ at/cm$^2$. Thus, clustering provided some protection against oxidation.

Figure 6:
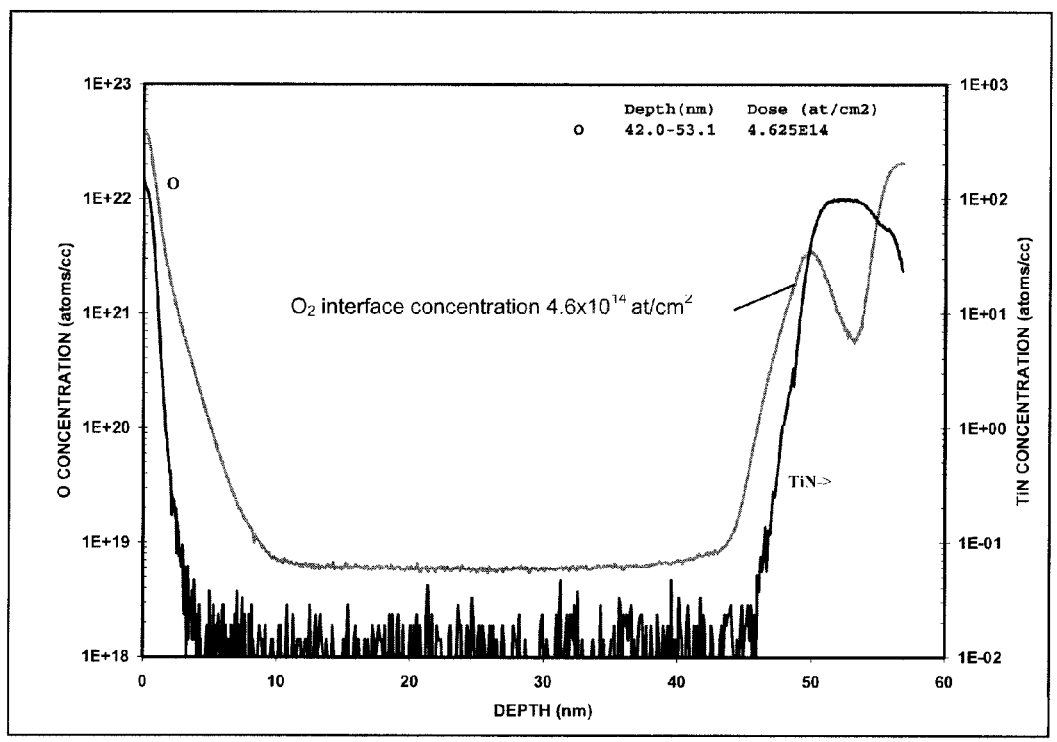
FIG. 6 is a graph illustrating oxygen levels at an aSi/TiN interface formed after providing a reducing gas ambient according to some embodiments of the invention.

Advantageously, with reference to FIG. 6, applying forming gas prior to and during boat-in (Trial 4) in accordance with an embodiment of the invention, resulted in a substantially lower oxygen concentration of $4.6 \times 10^{14}$ at/cm$^2$ at the TiN/$\alpha$-Si interface. Although the use of a forming gas during backfill (Trial 2) also resulted in a slight reduction of the oxygen interface concentration to $2.2 \, 10^{15}$ at/cm$^2$, this effect is relatively small in comparison to the benefits achieved in Trial 4. Without being limited by theory, it is believed that unintentional oxidation during loading is more likely to occur, or occurs to a greater extent, than unintentional oxidation during backfill after deposition.

TABLE I

α-Si/TiN

| Trial | 1 | 2 | 3 | 4 |
|---|---|---|---|---|
| Trial step | | | | |
| Bottom layer | TiN @ 500° C. | TiN @ 500° C. | TiN @ 500° C. | TiN @ 500° C. |
| Backfill gas | N2 | Forming gas | N2 | Forming gas |
| Boat out Temp | 300° C. | 300° C. | 300° C. | 300° C. |
| Boat out gas | $N_2$ | $N_2$ | $N_2$ | Forming gas |
| Reactors clustered ($N_2$ environment) | No | No | Yes | No |
| Boat in gas | $N_2$ | $N_2$ | $N_2$ | Forming gas |
| Purge/heat-up gas | $N_2$ | $N_2$ | $N_2$ | Forming gas |
| Top Layer | αSi @ 520° C. | αSi @ 520° C. | αSi @ 520° C. | αSi @ 520° C. |
| oxygen peak at interface (at/cm$^2$) | 2.6 e15 at/cm$^2$ | 2.2 e15 at/cm$^2$ | 1.5 e15 at/cm$^2$ | 4.6 e14 at/cm$^2$ |

Table 2 shows the results of various trials in which a α-Si bottom layer was formed in a first deposition chamber and a top α-Si layer was formed over the TiN layer in a second process chamber. The deposition chambers are clustered as in Trial 3 of Table 1. In Trial 1, forming gas was not used. In Trial 2, forming gas was flowed into the process chamber during back-fill, boat out, boat in, and purge and heat up of the process chamber before the deposition of the α-Si top layer.

Figure 7:
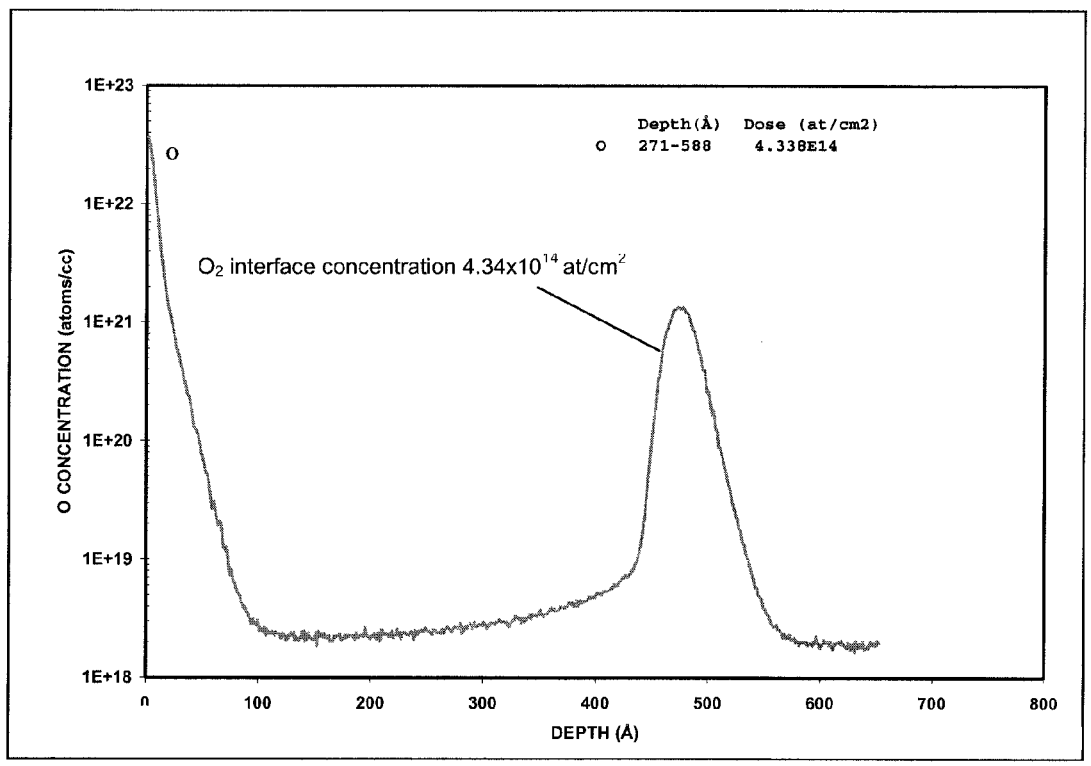
FIG. 7 is a graph illustrating oxygen levels at an aSi/aSi interface formed without using a reducing gas ambient before deposition of the top layer.
Figure 8:
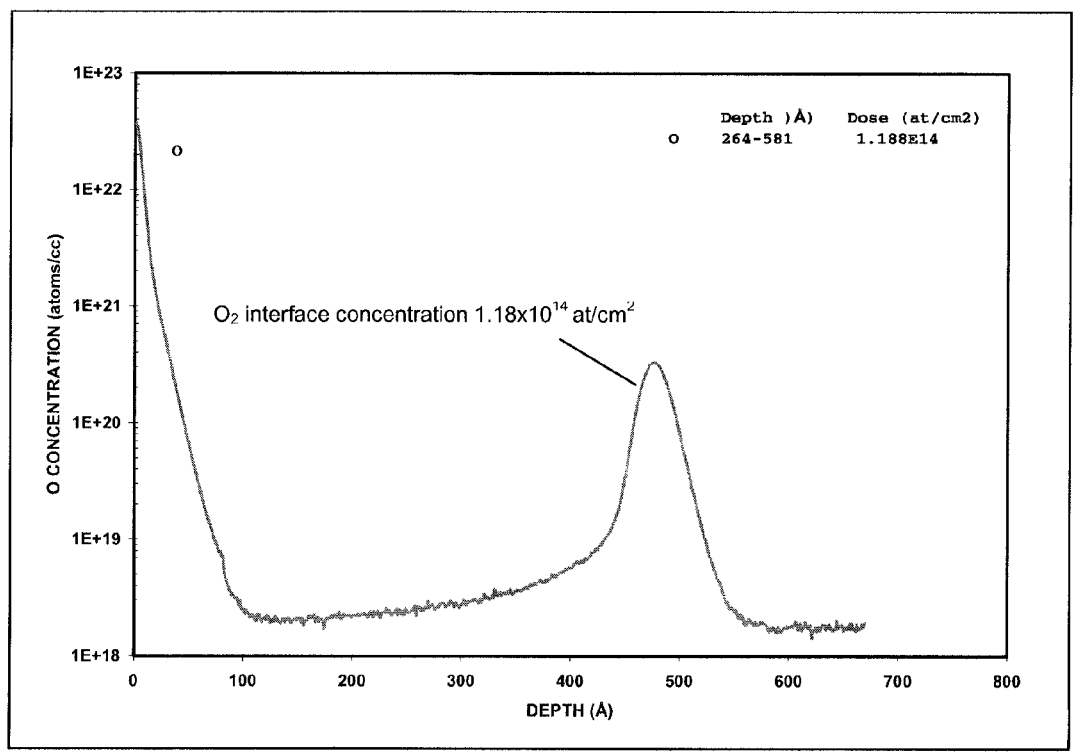
FIG. 8 is a graph illustrating oxygen levels at an aSi/aSi interface formed after providing a reducing gas ambient according to some embodiments of the invention.

With reference to FIG. 7, in the Trial 1 clustered process without any forming gas applied, an oxygen concentration of $4.34 \times 10^{14}$ at/cm$^2$ was measured at the interface of the α-Si layers. Without being limited by theory, this lower concentration, as compared to a TiN bottom layer, is believed to be explained by the greater resistance of α-Si to oxidation as compared to TiN. With reference to FIG. 8, even with this greater resistance, when applying forming gas in Trial 2, a reduction of the oxygen interface concentration to $1.18 \times 10^{14}$ at/cm$^2$ was advantageously achieved.

TABLE 2

αSi/αSi

| Trial | 1 | 2 |
|---|---|---|
| Trial step | | |
| Bottom layer | αSi @ 520° C. | αSi @ 520° C. |
| Backfill gas | $N_2$ | Forming gas |
| Boat out Temp | 300° C. | 300° C. |
| Boat out gas | $N_2$ | Forming gas + $N_2$ |
| Reactors clustered ($N_2$ environment) | Yes | Yes |
| Boat in gas | $N_2$ | Forming gas + $N_2$ |
| Purge/heat-up gas | $N_2$ | Forming gas |
| Top Layer | αSi @ 520° C. | αSi @ 520° C. |
| Area under oxygen peak at interface (at/cm$^2$) | 4.34 e14 at/cm$^2$ | 1.18 e14 at/cm$^2$ |

It will be apparent to those skilled in the art that various modifications and variations can be made in the present invention without departing from the scope or spirit of the invention. Thus, it is intended that the present invention cover the modifications and variations of this invention provided that they come within the scope of the appended claims or their equivalents.

We claim:

1. A method for thermal processing of substrates, comprising:
   providing a reducing gas ambient in a process chamber by flowing a reducing gas into the process chamber prior to loading one or more substrates into the process chamber, wherein providing the reducing gas ambient comprises flowing reducing gas into the process chamber at least while the process chamber is open;
   loading the one or more substrates into the reducing gas ambient in the process chamber while the process chamber is at a loading temperature; and
   processing the one or more substrates at a process temperature.

2. The method of claim 1, wherein loading the one or more substrates comprises continuing flowing the reducing gas into the process chamber.

3. The method of claim 1, further comprising heating the one or more substrates and the process chamber to the process temperature after loading the one or more substrates and before processing the one or more substrates.

4. The method of claim 1, wherein the one or more substrates comprises exposed metal-containing material.

5. The method of claim 4, wherein the metal-containing material is a metal nitride material.

6. The method of claim 5, wherein the metal-containing material is a titanium nitride material.

7. The method of claim 1, wherein the one or more substrate comprises exposed silicon.

8. The method of claim 1, wherein the reducing gas ambient comprises an inert gas and a reducing agent.

9. A method for thermal processing of substrates, comprising:
   providing a reducing gas ambient in a process chamber by flowing a reducing gas into the process chamber prior to loading one or more substrates into the process chamber;
   loading, the one or more substrates into the reducing gas ambient in the process chamber while the process chamber is at a loading temperature;
   heating the one or more substrates and the process chamber to a process temperature after loading the one or more substrates and before processing the one or more substrates, wherein heating the one or more substrates comprises flowing the reducing gas into the process chamber; and
   processing the one or more substrates at the process temperature.

10. A method for thermal processing of substrates, comprising:
   providing a reducing gas ambient in a process chamber by flowing a reducing gas into the process chamber prior to loading one or more substrates into the process chamber;
   loading the one or more substrates into the reducing gas ambient in the process chamber while the process chamber is at a loading temperature;
   reducing a pressure of the process chamber before processing the one or more substrates; and
   processing the one or more substrates at a process temperature.

11. A method for thermal processing of substrates, comprising:

providing a reducing gas ambient in a process chamber by flowing a reducing gas into the process chamber prior to loading one or more substrates into the process chamber;

loading the one or more substrates into the reducing gas ambient in the process chamber while the process chamber is at a loading temperature; and processing the one or more substrates at a process temperature, wherein processing the one or more substrates comprises performing a low pressure chemical vapor deposition process, wherein the pressure is about 10 Torr or less.

12. A method for thermal processing of substrates, comprising:

providing reducing gas ambient in a process chamber by flowing a reducing gas into the process chamber prior to loading one or more substrates into the process chamber;

loading the one or more substrates into the reducing gas ambient in the process chamber while the process chamber is at a loading temperature;

processing the one or more substrates at a process temperature; and cooling the process chamber to an unloading temperature and unloading the one or more substrates while the process chamber is at the unloading temperature.

13. A method for thermal processing of substrates, comprising:

providing a reducing gas ambient in a process chamber by flowing a reducing gas into the process chamber prior to loading one or more substrates into the process chamber, wherein the reducing gas ambient comprises an inert gas and a reducing agent, and wherein the reducing agent is $H_2$ gas having a concentration of less than about 10 vol % in the reducing gas ambient;

loading the one or more substrates into the reducing gas ambient in the process chamber while the process chamber is at a loading temperature, and processing the one or more substrates at a process temperature.

14. A method for thermal processing of substrates, comprising:

providing a reducing gas ambient in a process chamber by flowing a reducing gas into the process chamber prior to loading one or more substrates into the process chamber, wherein the reducing gas is a mixture of an inert gas and a reducing agent, wherein the reducing agent is about 1-10 vol. % of the mixture;

loading the one or more substrates into the reducing gas ambient in the process chamber while the process chamber is at a loading temperature; and processing the one or more substrates at a process temperature.

15. The method of claim 14, wherein the reducing agent is about 4 vol. % or less of the mixture.

16. A method for substrate processing, comprising:

depositing a first material on a substrate in a first process chamber;

unloading the substrate from the first process chamber;

subsequently loading the substrate into a second process chamber;

depositing a second material on the substrate in the second process chamber; and providing a reducing ambient in the second process chamber during subsequently loading the substrate into the second process chamber.

17. The method of claim 16, wherein providing the reducing ambient comprises flowing a gas comprising a reducing agent into the process chamber while loading the substrate into the second process chamber.

18. The method of claim 16, wherein providing the reducing ambient comprises flowing a gas comprising a reducing agent into the process chamber before loading the substrate into the second process chamber.

19. The method of claim 16, further comprising:

performing a deposition process on an other substrate in the second process chamber before depositing the second material; and unloading the other substrate from the second process chamber before depositing the second material, wherein providing the reducing ambient comprises flowing a reducing agent into the process chamber before unloading the other substrate.

20. The method of claim 19, wherein depositing the second material comprises loading the substrate into the process chamber after unloading the other substrate, wherein providing the reducing ambient comprises flowing the reducing agent into the process chamber while loading the substrate into the process chamber.

21. The method of claim 16, wherein depositing the first material comprises depositing a material chosen from the group consisting of a silicon-containing material, a metal, and a metal nitride.

22. The method of claim 21, wherein depositing the second material comprises depositing a material chosen from the group consisting of a silicon-containing material, a metal, and a metal nitride, wherein the second material is different from the first material.

23. The method of claim 16, wherein the first and the second process chambers are batch process chambers, wherein loading and unloading the substrate comprises loading and unloading a wafer boat accommodating the substrate.

24. The method of claim 16, wherein the first and the second process chambers are disposed in a common, sealed mini-environment.

* * * * *

UNITED STATES PATENT AND TRADEMARK OFFICE
CERTIFICATE OF CORRECTION

PATENT NO. : 8,507,388 B2
APPLICATION NO. : 12/767657
DATED : August 13, 2013
INVENTOR(S) : Van Aerde et al.

Page 1 of 1

It is certified that error appears in the above-identified patent and that said Letters Patent is hereby corrected as shown below:

On the Title Page

Column 2 (page 1, item [56]) at line 20, Other Publications, change "lnstitut" to --Institut--.

Column 2 (page 2, item [56]) at line 24, Other Publications, change "electrital" to --electrical--.

Column 2 (page 2, item [56]) at line 34, Other Publications, change "Inchon," to --Incheon--.

In the Specification

Column 2 at line 15, change "invention." to --invention;--.

Column 5 at line 54, change "on" to --one--.

In the Claims

Column 10 at line 14, in Claim 1, change "flowing" to --flowing the--.

Column 10 at line 43, in Claim 9, change "loading," to --loading--.

Column 11 at line 14, in Claim 12, change "providing" to --providing a--.

Column 11 at line 36, in Claim 13, change "temperature," to --temperature;--.

Signed and Sealed this
Thirteenth Day of May, 2014

Michelle K. Lee
*Deputy Director of the United States Patent and Trademark Office*